United States Patent [19]

Rodgers, III

[11] Patent Number: 4,547,799
[45] Date of Patent: Oct. 15, 1985

[54] FEEDBACK KINESCOPE DRIVER

[75] Inventor: Robert L. Rodgers, III, Lancaster, Pa.

[73] Assignee: RCA Corporation, Princeton, N.J.

[21] Appl. No.: 532,335

[22] Filed: May 31, 1983

[51] Int. Cl.⁴ .............................................. H04N 9/20
[52] U.S. Cl. ...................................... 358/74; 358/243
[58] Field of Search .................. 358/21 R, 27, 40, 39, 358/64, 74, 243

[56] References Cited

U.S. PATENT DOCUMENTS

| | | | |
|---|---|---|---|
| 3,823,264 | 7/1974 | Haferl | 178/7.5 R |
| 3,970,895 | 7/1976 | Willis | 315/381 |
| 3,996,609 | 12/1976 | Avery | 358/30 |
| 4,096,517 | 6/1978 | Hinn | 358/40 |

FOREIGN PATENT DOCUMENTS

| | | |
|---|---|---|
| 739829 | 11/1955 | United Kingdom . |
| 1090912 | 11/1967 | United Kingdom . |
| 1191650 | 5/1970 | United Kingdom . |
| 1191559 | 5/1970 | United Kingdom . |
| 1204215 | 9/1970 | United Kingdom . |
| 1494429 | 12/1977 | United Kingdom . |

OTHER PUBLICATIONS

Technical Manual for RGB Color Monitor Models 7111/7211, manufactured by Conrac.

Primary Examiner—Michael A. Masinick
Attorney, Agent, or Firm—P. J. Rasmussen; P. M. Emanuel; R. H. Kurdyla

[57] ABSTRACT

A kinescope driver stage includes an input amplifier transistor arranged in a cascode amplifier configuration with an output amplifier transistor. The low impedance emitter electrode of the input transistor is coupled to a reference potential via an impedance network. Degenerative feedback is provided from the impedance network to input circuits of the input amplifier.

10 Claims, 1 Drawing Figure

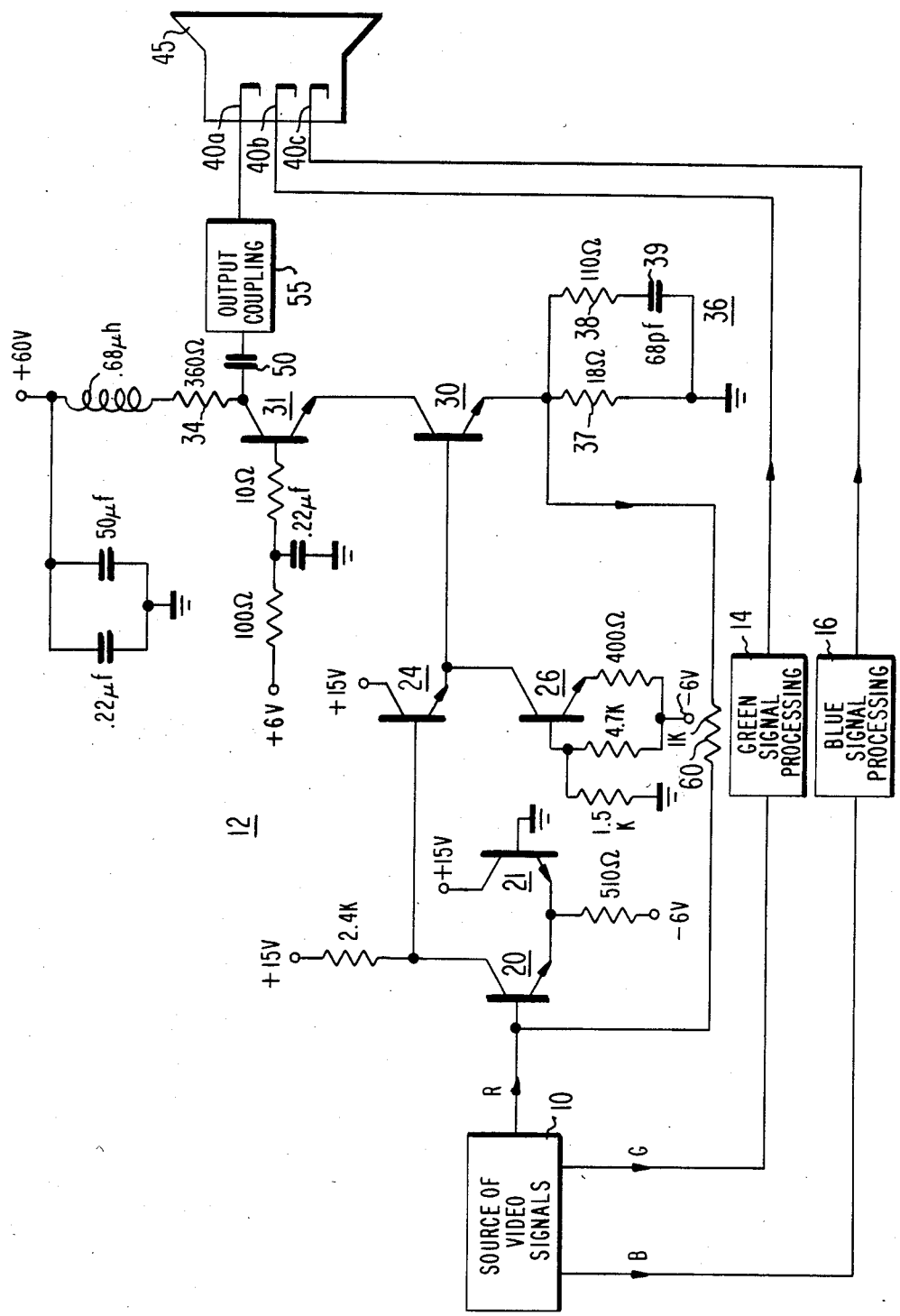

FEEDBACK KINESCOPE DRIVER

This invention concerns a video amplifier for providing video information drive signals to an image display device such as a kinescope in a video signal processing system.

Kinescope driver stages sometimes utilize feedback for establishing the signal gain and linear operating range of the driver stage, for stabilizing the output operating potential of the stage, and for reducing the impedance presented to the kinescope. In the case of a kinescope driver arranged in a cascode amplifier configuration for example, such feedback is employed from the output of an upper rank amplifier transistor which drives the kinescope directly, to the input of a lower rank transistor amplifier which supplies signal current to the upper rank amplifier.

It is herein recognized that feedback of this type may create difficulties in certain signal processing applications, such as in a video processing system using kinescope driver stages designed to operate over a much wider signal bandwidth (e.g., 30 MHz) compared to the relatively narrower bandwidth capability (e.g., 4 MHz) often exhibited by driver stages in conventional television receivers. The wider bandwidth capability may be required by a video signal monitor for example, where a high definition picture display is desirable. Feedback of the type described can lead to signal processing instability (e.g., circuit oscillation) due to the effects of parasitic capacitances in a wide bandwidth system.

It is therefore recognized as desirable to avoid feedback of the type described, while maintaining linear operation of the kinescope driver stage to preserve the quality of a picture reproduced by a wide bandwidth system. In this regard it is noted that wideband kinescope drivers often operate at significantly higher current levels compared to more conventional drivers with narrowband capability such as are commonly used in television receivers. This result is often attributable to the significantly lower output load impedance of the wideband driver, which is effective to reduce the bandwidth limiting effects of parasitic capacitances associated with the kinescope and the kinescope driver itself. Significantly higher currents lead to increased thermal dissipation and heating effects which can ultimately lead to non-linearities in the operation of the kinescope driver amplifier. Non-linearities from other sources, such as transistor beta ($\beta$) variations, are also undesirable in a wideband, high definition video signal processing and display system.

In accordance with the principles of the present invention there is disclosed herein a feedback kinescope driver stage suitable for use in a wideband, high definition video display system such as a color monitor. The driver stage includes an amplifier with a first terminal for receiving input signals from an input circuit, a second terminal for supplying output signal currents to an image display device via an output circuit, and a low-impedance third terminal coupled to an operating potential via an impedance network. The second and third terminals define a main current path of the amplifier. Degenerative feedback is provided from the impedance network to the input circuit to form a feedback control loop for maintaining linear operation of the amplifier.

The drawing FIGURE shows a portion of a wideband color video signal processing system. A signal source 10 provides wide bandwidth (e.g., 30 MHz) red (R), green (G), and blue (B) color image representative video signals to respective red, green and blue video signal processors 12, 14 and 16. Since video signal processors 12, 14 and 16 are similar, only red signal processor 12 is shown in detail and will be discussed.

The R signal is supplied as a current from a high impedance source in unit 10 to a pre-amplifier stage comprising transistors 20,21 arranged as a differential amplifier. Amplified signals from the collector output circuit of transistor 20 are coupled via an emitter follower buffer transistor 24 to a kinescope driver stage including transistors 30 and 31 biased for Class A operation. A transistor 26 comprises a current source for emitter follower transistor 24.

Transistor 30 of the driver stage comprises an input lower rank, common emitter amplifier transistor, which together with an output upper rank common base amplifier transistor 31 forms a cascode kinescope driver stage with wide bandwidth (30 MHz) signal amplifying capability. The 2N5943 transistor type can be used for transistor 30, and the LT-1839 transistor type can be used for transistor 31. The latter transistor type is available commercially from TRW Semiconductors.

High level red video signals from the collector output circuit of transistor 31 are applied to a red cathode 40a of a color kinescope 45 via an AC coupling capacitor 50 and an output coupling network 55. Similarly, high level green and blue video signals from processors 14 and 16 are coupled to green and blue cathodes 40b and 40c of kinescope 45. Output coupling network 55 may include a kinescope arc current limiting resistor, and a DC restoration circuit which coacts with the AC coupling capacitor to establish a desired DC bias condition for the kinescope cathode.

The collector load circuit of output transistor 31 exhibits a relatively low impedance as primarily determined by the value of a resistor 34. The emitter circuit of lower rank input transistor 30 comprises an impedance network 36 coupled between the emitter of transistor 30 and ground reference potential. Network 36 includes a resistor 37 in parallel with the series combination of a resistor 38 and a capacitor 39. The function of network 36, particularly with respect to capacitor 39, is to increase the emitter current of transistor 30 (i.e., increase the gain of transistor 30) at high signal frequencies. In this respect network 36 exhibits a decreasing impedance with increasing signal frequencies.

Impedance network 36 also serves as a current sampling network associated with a degenerative feedback loop including a resistor 60, pre-amplifier transistor 20, emitter follower transistor 24 and input transistor 30 of the kinescope driver stage. The circuit including transistors 20,21 together with transistors 24 and 30 and feedback resistor 60 corresponds to a feedback operational amplifier. The base input of transistor 20 corresponds to an inverting input of the operational amplifier. A ground reference potential is applied to the non-inverting amplifier input at the base of transistor 21.

The emitter current of transistor 30, which determines the collector output current of video output transistor 31, is subject to exhibiting non-linearities due to temperature effects and variations of transistor $\beta$, for example. Temperature effects become an increasingly important factor when transistors 30 and 31 conduct relatively large currents. In this regard it is noted that in order to maintain wideband signal amplifying ability, wideband driver stage 30,31 exhibits a significantly lower output impedance and conducts significantly greater currents compared to narrowband driver stages such as are commonly employed in television receivers.

The described feedback loop including resistor 60 compensates for such non-linearities and assists to maintain the temperature stability of the driver stage. A voltage developed across impedance network 36 is representative of the magnitude of the video signal representative emitter current of driver transistor 30, including any non-linear current components. This voltage is continuously fed back to the base of driver transistor 30 via resistor 60 and transistors 20,24, such that the base signal voltage of transistor 30 exhibits a magnitude and sense for producing a linear emitter current for transistor 30. Specifically, the base drive voltage of transistor 30 includes a component related to the non-linear emitter current component, but with a magnitude and sense for substantially negating the effect of the emitter current non-linearity.

Linear current conduction of transistor 30 is important since the signal current conducted by transistor 30 substantially corresponds to the output signal current conducted by video output transistor 31. A non-linear output signal current would impair the quality of a picture reproduced in response to video signals conducted by the kinescope driver stage.

The described feedback arrangement avoids problems which would result if feedback was provided from the collector output of video output device 31 to an input circuit of the kinescope driver. The collector of a transistor exhibits an impedance which, in combination with parasitic capacitances, can lead to undesirable phase and timing delay errors which would impair the effectiveness of the feedback network and impair the quality of a reproduced picture. Such errors are particularly likely to occur in view of the high frequency (30 MHz) video signals being processed, and can lead to distortion effects such as output signal ringing. In addition, the high frequencies involved increase the likelihood of circuit instability (e.g., spurious oscillation) depending on the gain of the feedback loop and the phase shift induced by the parasitic capacitances. Such parasitic capacitances include capacitances associated with the video output device itself, and output wiring and connector capacitances, for example.

In the illustrated feedback arrangement, the feedback control voltage is derived from the low impedance emitter of transistor 30, which substantially reduces the impact of parasitic capacitances. The disclosed feedback arrangement exhibits good stability at high frequencies and does not exhibit detrimental feedback phase and timing delay errors, while providing current linearity compensation and temperature stability. The feedback network also serves to assure that the signal current conducted by the video driver stage maintains a substantially linear relationship with the red (R) input signal voltage provided from source 10.

The disclosed feedback kinescope driver arrangement is particularly useful in conjunction with wideband, high definition video display systems such as video monitors used in broadcast studios to monitor the quality of broadcast video signals, as well as in conjunction with systems intended to display alphanumeric characters with good edge definition as associated with wideband video signals. Systems of the latter type can include home television receivers with provision for displaying alphanumeric information (e.g., Teletext and computer derived data) as supplied via auxiliary inputs, as well as dedicated display monitors associated with computer terminals.

What is claimed is:

1. In a video signal processing system including an image display device responsive to image representative video information signals applied to an intensity control electrode thereof, apparatus comprising:
   display driver amplifier means having a signal input first terminal, a signal output second terminal, and a third terminal at which a low impedance is exhibited by said amplifier means; said second and third terminals defining a main current path of said amplifier means;
   input circuit means for providing image representative video signals to said first terminal of said amplifier means;
   impedance means for coupling said third terminal of said amplifier means to a reference potential, said impedance means including resistive and reactive circuit means for increasing the current conducted by said amplifier means at high video signal frequencies;
   output circuit means for providing video signals derived from said second terminal of said amplifier means to said intensity control electrode of said image display device; and
   feedback means coupled from said third terminal of said amplifier means to said input circuit means to form a degenerative video signal feedback loop.

2. Apparatus according to claim 1, wherein said degenerative feedback loop is DC coupled.

3. Apparatus according to claim 2, wherein said input circuit means comprises a DC coupled pre-amplifier network; and
   said feedback means is coupled from said third terminal of said amplifier means to an input of said pre-amplifier network.

4. Apparatus according to claim 1, wherein
   closed loop signal feedback for said amplifier means is provided primarily by said feedback means.

5. In a video signal processing system including an image display device responsive to image representative video information signals applied to an intensity control electrode thereof, display driver apparatus comprising:
   first amplifier means having a signal input first terminal, a signal output second terminal, and a third terminal at which a low impedance is exhibited by said amplifier means; said second and third terminals defining a main current conduction path of said first amplifier means;
   second amplifier means arranged in a cascode amplifier configuration with said first amplifier means, and having a first terminal coupled to a bias potential, a signal output second terminal coupled to a load impedance and a third terminal coupled to said signal output second terminal of said first amplifier means; said second and third terminals defining a main current conduction path of said second amplifier means;
   input circuit means for providing image representative video signals to said first terminal of said first amplifier means;
   impedance means for coupling said third terminal of said first amplifier means to a reference potential;
   output circuit means for providing video output signals derived from said output second terminal of said second amplifier means to said intensity control electrode of said image display device; and feedback means coupled from said third terminal of said first amplifier means to said input circuit means to form a degenerative video signal feedback loop.

6. Apparatus according to claim 5, wherein said degenerative feedback loop is DC coupled.

7. Apparatus according to claim 6, wherein
said input circuit means comprises a DC coupled pre-amplifier network; and
said feedback means is coupled from said third terminal of said first amplifier means to an input of said pre-amplifier network.

8. Apparatus according to claim 5, wherein
said impedance means includes resistive and reactive circuit means for increasing the current conducted by said amplifier means at high video signal frequencies.

9. Apparatus according to claim 5, wherein
said output circuit means includes means for AC coupling video output signals from said second amplifier means to said intensity control electrode.

10. Apparatus according to claim 5, wherein
said first and second amplifier means each comprises a transistor having base collector and emitter electrodes respectively corresponding to said first, second and third terminals.

* * * * *